(12) United States Patent
Hashimoto et al.

(10) Patent No.: US 6,512,759 B1
(45) Date of Patent: Jan. 28, 2003

(54) TRANSMITTER AND RECEIVER

(75) Inventors: Akinori Hashimoto, Tokyo (JP);
Hajime Matsumura, Tokyo (JP); Junji Kumada, Tokyo (JP); Hisakazu Katoh, Tokyo (JP)

(73) Assignee: Nippon Hoso Kyokai, Tokyo (JP)

( * ) Notice: Subject to any disclaimer, the term of this patent is extended or adjusted under 35 U.S.C. 154(b) by 0 days.

(21) Appl. No.: 09/367,190
(22) PCT Filed: Dec. 16, 1998
(86) PCT No.: PCT/JP98/05680
§ 371 (c)(1),
(2), (4) Date: Aug. 4, 1999
(87) PCT Pub. No.: WO99/31836
PCT Pub. Date: Jun. 24, 1999

(30) Foreign Application Priority Data

Dec. 16, 1997 (JP) .............................................. 9-364037

(51) Int. Cl.$^7$ ................................................. H04Q 7/32
(52) U.S. Cl. ........................ 370/347; 370/204; 370/345; 370/342; 370/503; 370/470; 370/510
(58) Field of Search ................................ 370/204, 210, 370/328, 329, 345, 347, 336, 337, 342, 503, 510, 470; 455/517, 466, 67.3, 63, 550

(56) References Cited

U.S. PATENT DOCUMENTS 5,583,562 A 12/1996 Birch et al.
6,108,384 A * 8/2000 Okumura et al. ............ 370/342

FOREIGN PATENT DOCUMENTS

EP 0 759 665 A1 2/1997

OTHER PUBLICATIONS

Katoh et al. "Study on Satellite ISDB transmission system" NHK Science and Technical Research Laboratories, ITE Technical Report, vol. 21, No. 25, pp. 1–6, Mar. 12, 1997.

Katoh et al. "An application of a hierarchical transmission to satellite ISDB on the 12 GHz band", NHK Science and Technical Research Laboratories, ITE Technical Report, vol. 20, No. 22, Mar. 14, 1996, pp. 11–16.

Hashimoto et al., "Development of A Transmission System And An Integrated Receiver For Satellite ISDB", IEEE Trans. Consum. Electron; IEEE Transactions On Consumer Electronics, vol. 43(3):337–343, (1997).

Hishimoto et al., "Development of A Transmission System And An Integrated Receiver For Satellite ISDB", Proceedings Of The 1997 16th International Conference On Consumer Slectronics, pp. 42 and 43, (1997).

Kawai et al., "Transport Structure For Integrated Services Digital Broadcasting", IEICE Trans. Communications, vol. E77–B(12):1474–1479, (1994).

Katoh et al., "A Flexible Transmission Technique For The Satellite ISDB System", IEEE Transactions On Broadcasting, vol. 42(3):159–166, (1996).

* cited by examiner

Primary Examiner—William Trost
Assistant Examiner—Keith Ferguson
(74) Attorney, Agent, or Firm—Venable; Robert J. Frank

(57) ABSTRACT

An interleave frame is formed by combining slots corresponding to the same slot number in each frame when interleave process is performed in a super frame, and the data are read out along row or column direction (i.e. readout direction) and the data are written along the direction opposite to the readout direction in the same memory.

2 Claims, 7 Drawing Sheets

TRANSMITTER AND RECEIVER

TECHNICAL FIELD

The present invention relates to an interleaving technique involved in digital modulation and demodulation, especially to a transmitter and a receiver capable of performing the unified interleave and deinterleave without employing an interleave method corresponding to a multiplexing scheme based on each transmission mode when implementing multiplex transmission combining a plurality of transmission modes with different error endurance.

BACKGROUND ART

FIG. 4 shows a multiplexed signal structure in which a frame structure is comprised of one frame including 48 slots and one super frame is structured by eight frames, for example. Here, a slot is a memory area for storing a packet consisting of 204 bytes adding a 16-byte RS(204, 188) error correction code to a 188-byte MPEG-2 TS packet. In digital transmission using a broadcasting satellite, it is assumed that the slots of the same number of each frame in a super frame, may use the same type transmission mode including the modulation scheme and error correction code, and four types of transmission modes can be used at maximum in one super frame. In addition, the transmission modes in the super frame are flexibly varied by reporting those modes from a transmitting side to a receiving side by using a control signal called a TMCC signal contained in the second previous super frame.

FIG. 5 shows the structure of a modulated signal generated from the multiplexed signal. In this case, the multiplexed data is subjected to interleaving in the transmitter side and deinterleaving in the receiving side in order to derive the full power of Reed-Solomon (RS) codes, typical external codes, by distributing burst errors which occur when the number of bit errors in the transmission channel are beyond the error correcting capability of a Viterbi decoder or a trellis decoder used for error correction in the receiver. For example, interleaving of depth eight is implemented by forming interleave frames at every eight slots using the same type transmission mode in a frame, and by reading out of the column the data of the interleave frames written into a row in a two dimensional memory. (When the number of the slots using the same type transmission mode is less than eight in a frame, or the number of the remaining slots is less than eight when the interleave frames are formed every eight slots in sequence, the interleave frame is structured in addition to slots of a frame which will be described later.

As structural examples, the implementing interleave process will now be described with reference to FIGS. 6 and 7. FIG. 6 shows an example in which 46 slots are transmitted by TC-8 PSK and one slot is transmitted by QPSK subjected to convolutional encoding with a coding rated of ½, and further, one slot is regarded as a dummy slot. FIG. 7 shows an example in which 44 slots are transmitted by TC-8 PSK and one slot is transmitted by BPSK subjected to convolutional encoding with a coding rate of ½, and further, three slots are regarded as dummy slots.

In either example, as for the one slot transmitted by QPSK or BPSK, one interleave frame is formed in one super frame. To match the timing of signals after the interleaving, a first-in-first-out (FIFO) memory for storing data with a length of the super frame {(data length of assigned slots)-(length of the interleave frame)} is necessary for the greater assigned slot number (in the above example, the 46 slots or 44 slots data transmitted by the TC-8 PSK).

Since the interleave frame is 204×8 bytes, a FIFO memory is comprised of 204×46×8−204×8=73440 bytes in the example of FIG. 6, and shows a FIFO memory is comprised of 204×44×8−204×8=70176 bytes in the example of FIG. 7, thus performing the interleave process by once storing the data amount close to one super frame every each transmission mode.

However, the capacity of the FIFO memory changes according to the assigned slot number for each of transmission modes in the frame, and a controller controlling the interleave process should be needed because address control is changed according to the change of the capacity of the FIFO memory, thereby complicating a circuit structure.

SUMMARY OF THE INVENTION

Therefore, an object of the present invention is to provide a transmitter and a receiver implementing an interleave process simply without changing the circuit configuration by changing the assigned slot number according to the transmission mode in each frame.

In the first aspect of the present invention, there is provided a transmitter applicable to a transmission system capable of transmitting digital data (called the transmission coded signal), which are encoded by using different types of error correction codes and modulated by different types of modulation with schemes, as packet units in the multiplexed data with a frame structure consisting of N packets, said transmitter performing interleaving of a super frame unit, and comprising:

means for forming an interleave frame by combining packets corresponding to the same slot number in each frame;

write means for sequentially writing data according to a frame number of the interleave frame into a two-dimensionally arrangeable memory along a row or a column direction; and readout means for sequentially reading out the written data from the two-dimensionally arrangeable memory along a column or row direction different from the row or column direction of said write means.

In the second aspect of the present invention, there is provided a receiver applicable to a transmission system capable of transmitting digital data (called transmission coded signal), which are encoded by using different types of error correction codes and are modulated by different types of modulation techniques, as packet unit in the multiplexed data with a frame structure consisting of N packets, said receiver performing deinterleaving of a super frame unit, and comprising:

means for forming a deinterleave frame by combining packets corresponding to the same slot number in each frame;

write means for sequentially writing data according to a frame number of the deinterleave frame into a two-dimensionally arrangeable memory along the column or row direction corresponding to the readout direction of an interleave process during transmission; and readout means for sequentially reading out the written data from the two-dimensionally arrangeable memory along the row or column direction different from the column or row direction of said write means corresponding to the writing direction of the interleave process during transmission.

BEST MODE FOR CARRYING OUT THE INVENTION

A preferred embodiment of the present invention will be described in detail with reference to the drawings.

The present invention relates to an interleave process applicable to digital transmission. In particular, in a transmission system that can transmit mixed data comprising of different types of transmission modes as packet units in the multiplexed data with a frame structure consisting of N packets, an interleave frame is formed by combining slots corresponding to the same slot number in each frame, and the interleave process is performed every interleave frame, thus simply performing the interleave process under the same memory control even though various types of transmission modes in mixed data may be transmitted.

This example refers to a reading and writing process of a transmission system in that interleave in the transmitter and deinterleave in the receiver, which is opposite to the interleave can be performed. A concrete example will be described as follows.

Figure 1:
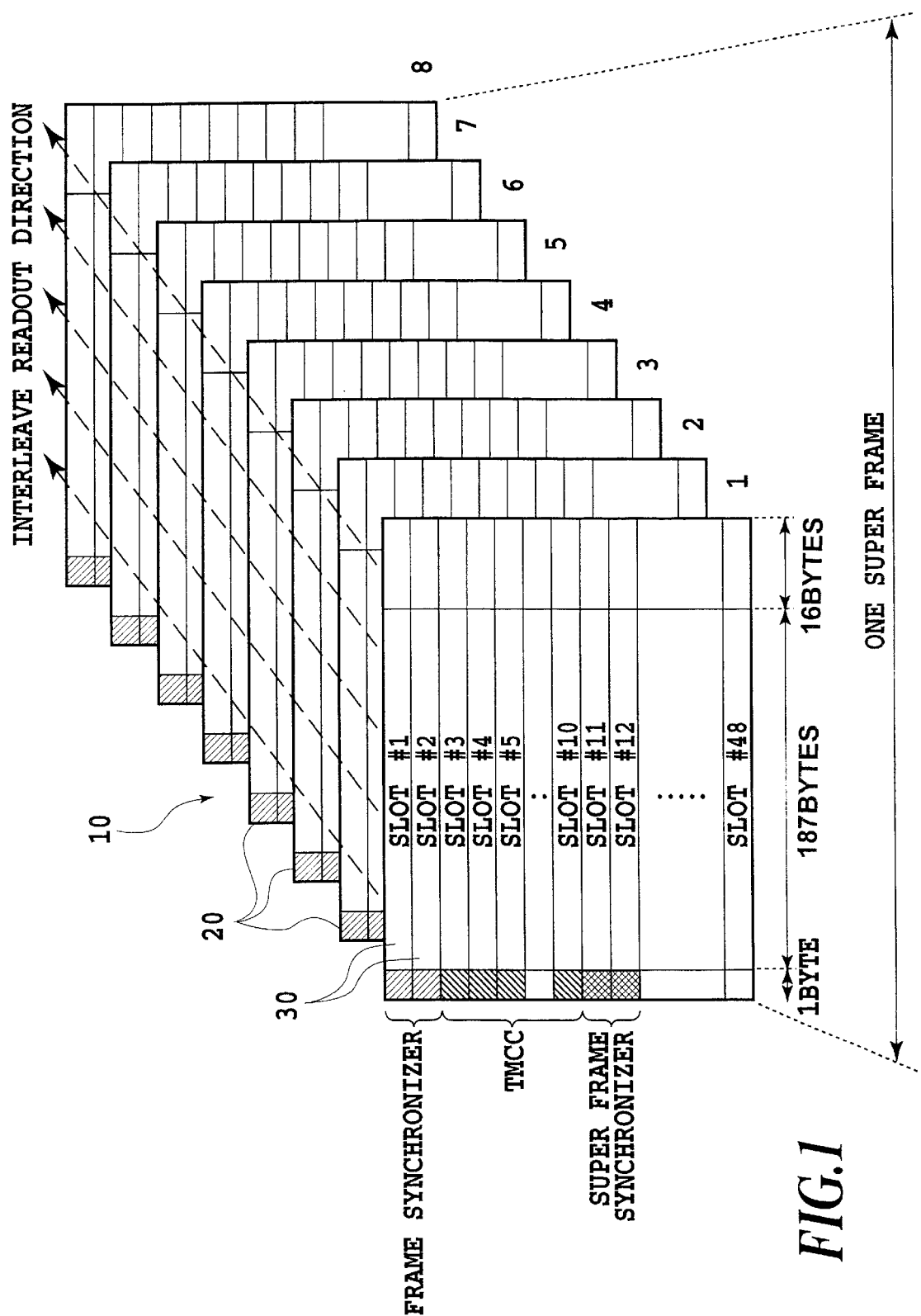
FIG. 1 is a schematic perspective view showing a frame structure as an embodiment according to the present invention.
Figure 2:
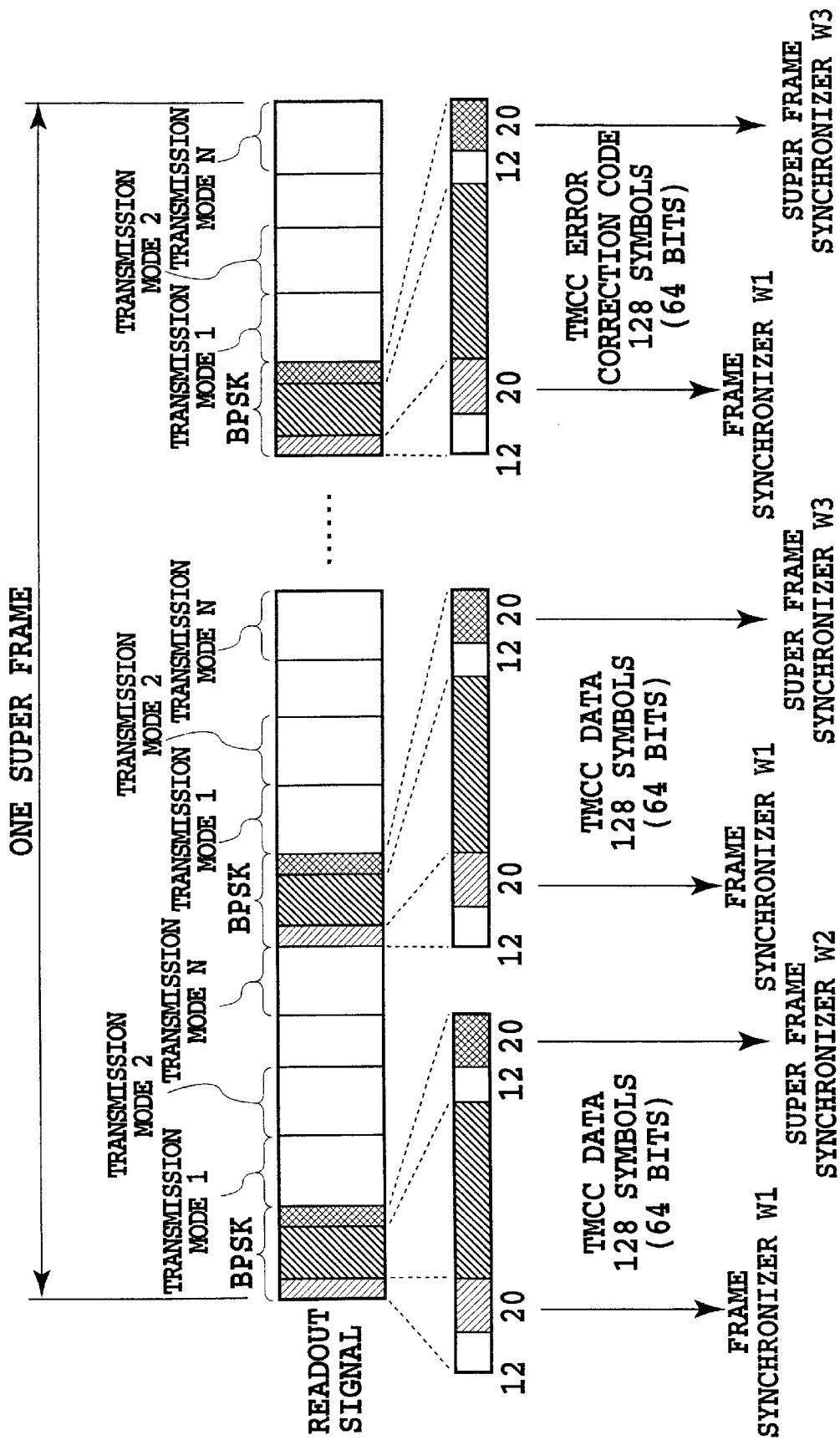
FIG. 2 is a diagram showing a data arrangement in frames according to the present invention.

FIG. 1 shows the structure of a single super frame 10. The super frame 10 is structured by eight frames 20. Each frame 20 consists of 48 slots 30. These slots 30 are structured by various types of signals, such as multiplexed signals including video, audio and associated informations, a frame synchronizer, TMCC and super frame synchronizer. One slot 30 consists of (1+187+16) bytes. FIG. 2 shows the frames 20 in the super frame 10 sequentially arranged.

The processings performed by the transmission and reception of the system will be described with reference to FIGS. 3(a) to 3(e).

Figure 3:
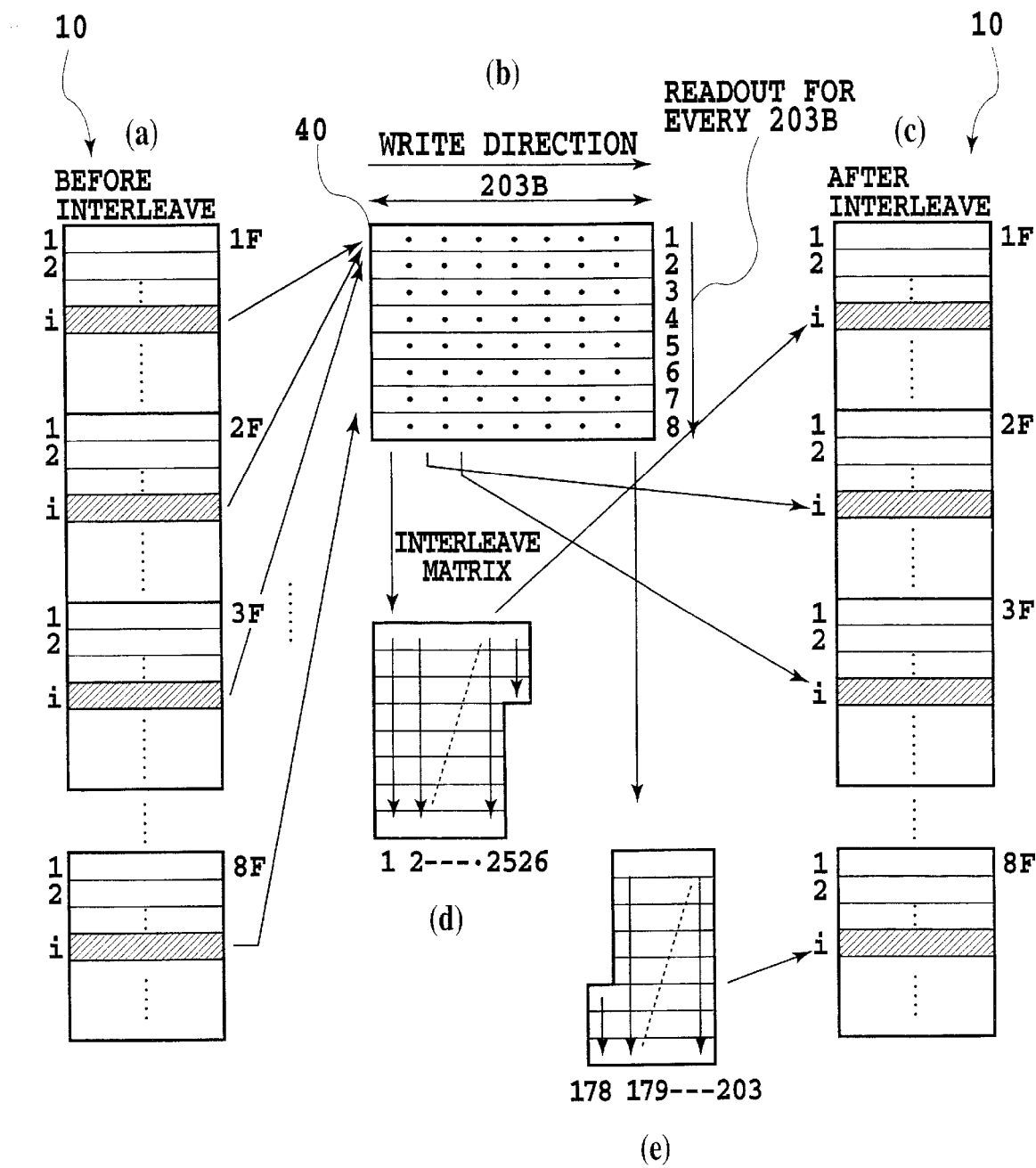
FIG. 3 is a diagram showing an example of an interleave process.
Figure 4:
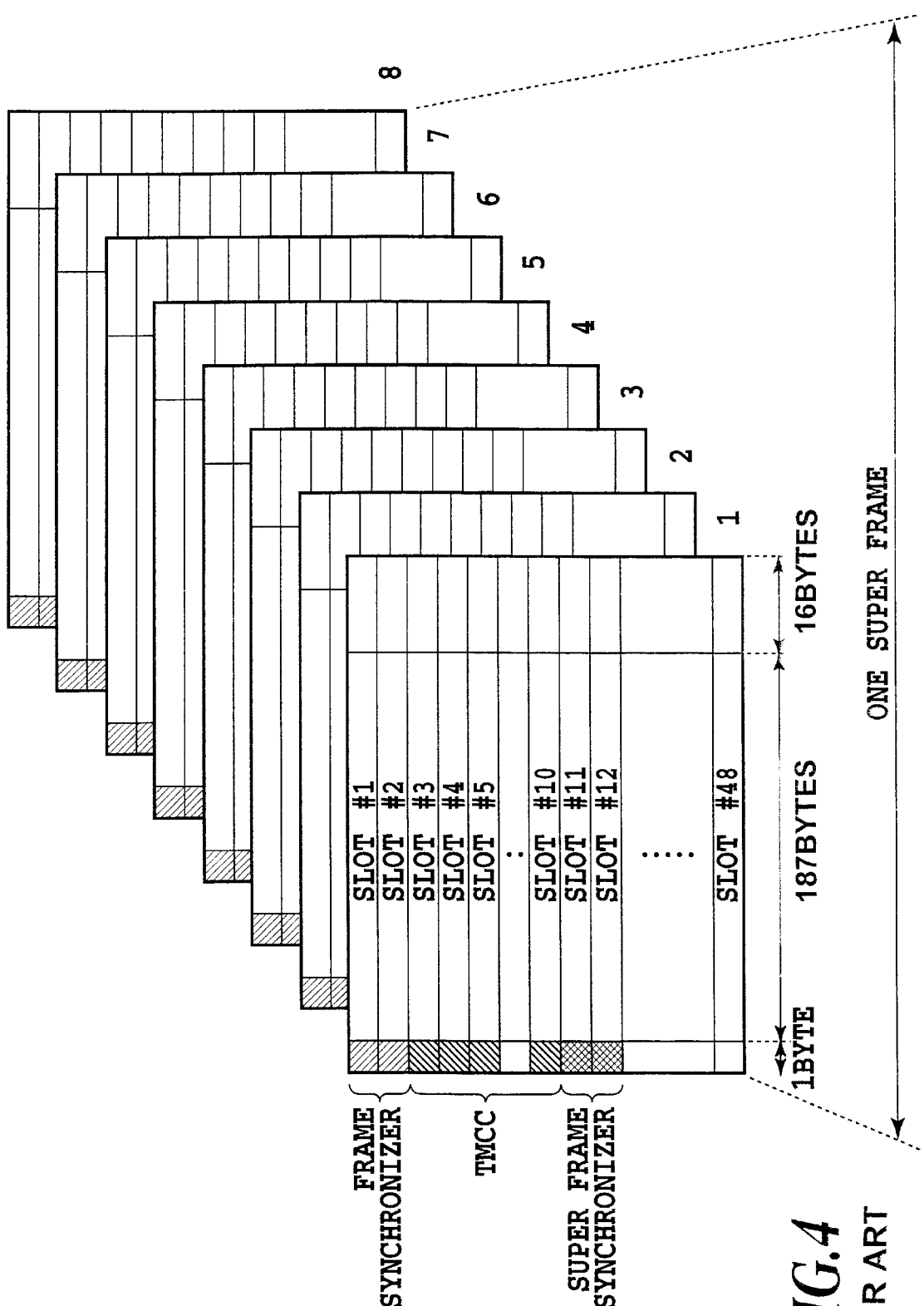
FIG. 4 is a schematic perspective view showing a conventional frame structure.
Figure 5:
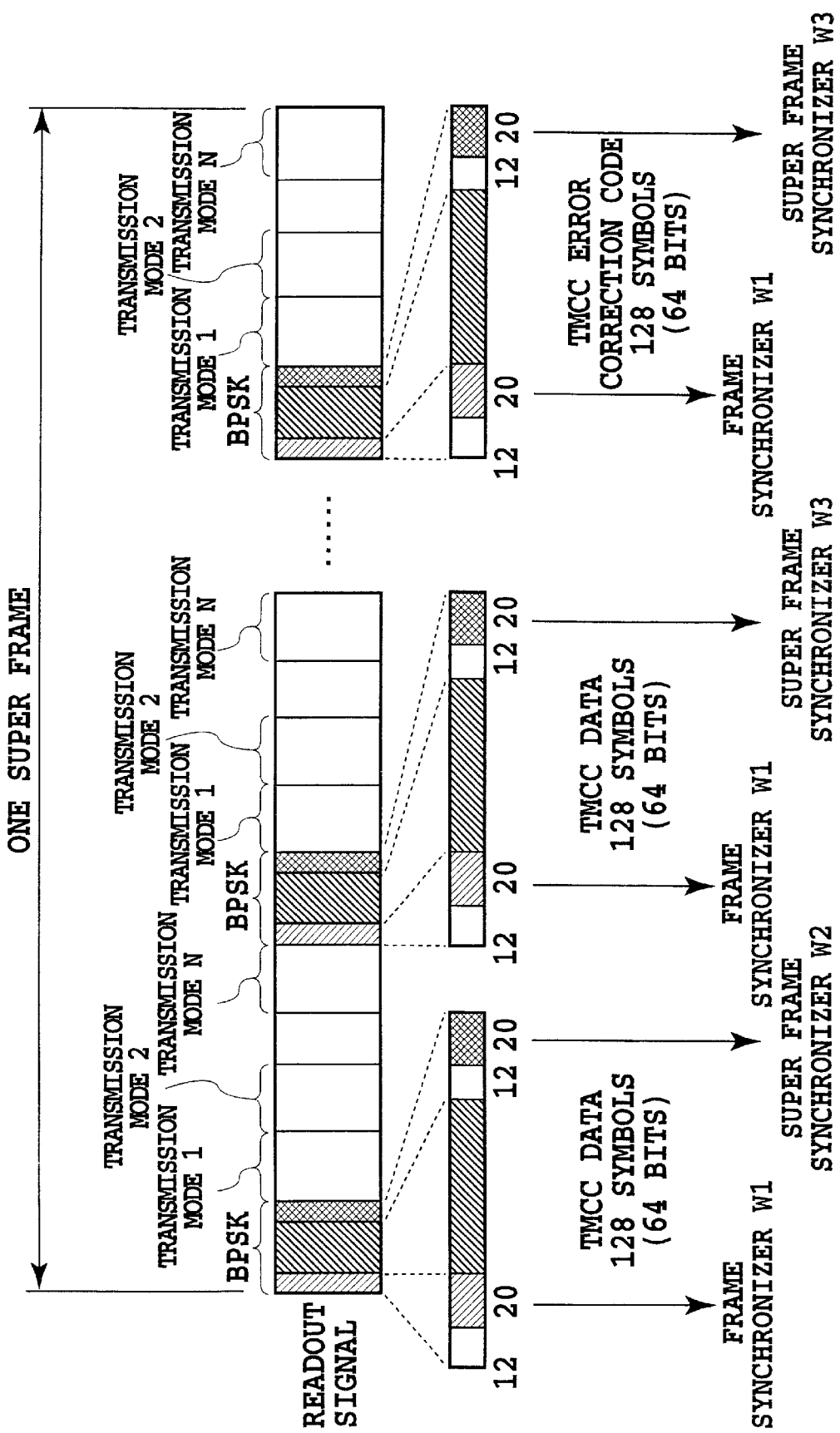
FIG. 5 is a diagram showing a data arrangement in conventional frames.
Figure 6:
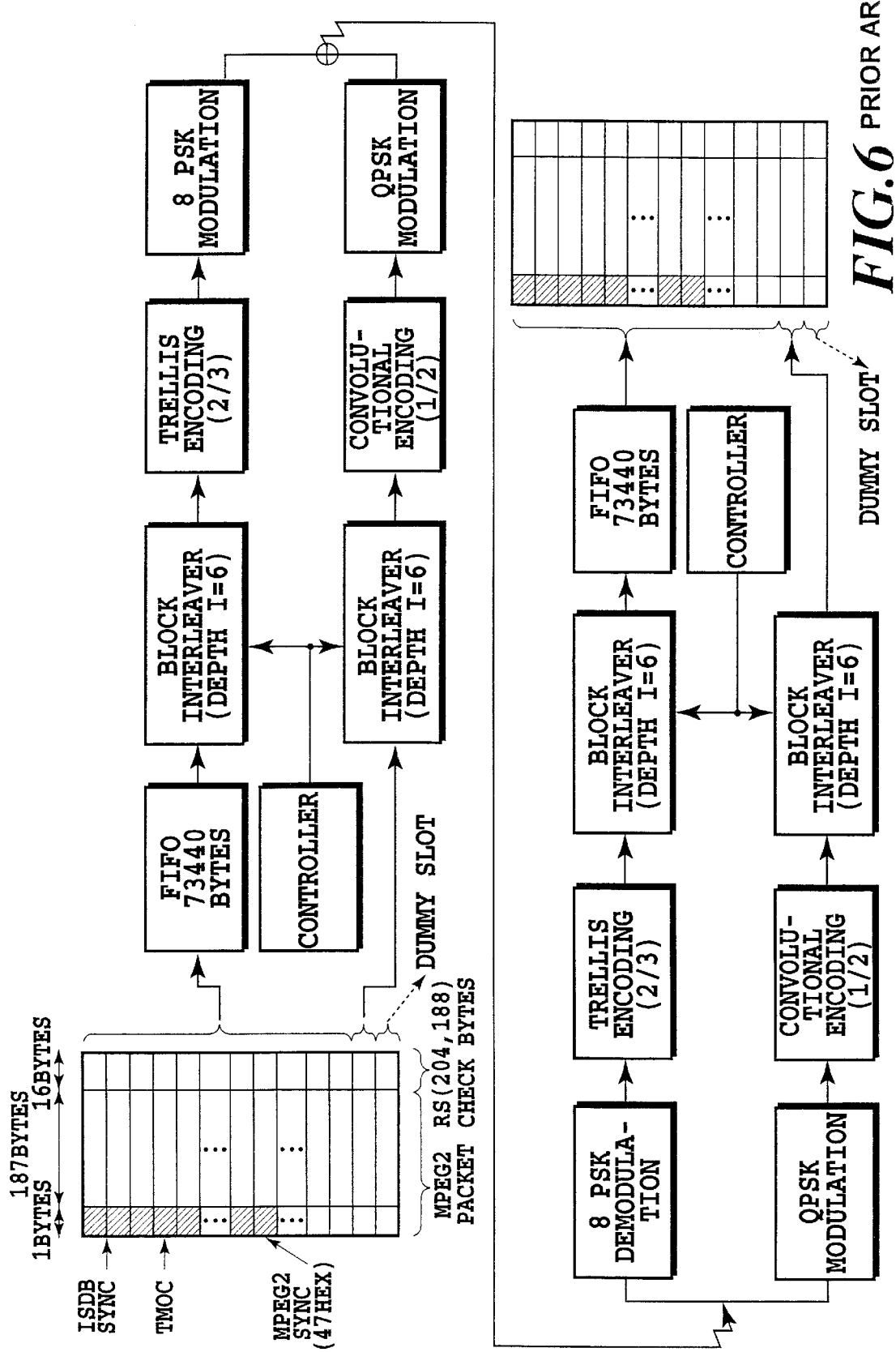
FIG. 6 is a block diagram showing a conventional transmission process.
Figure 7:
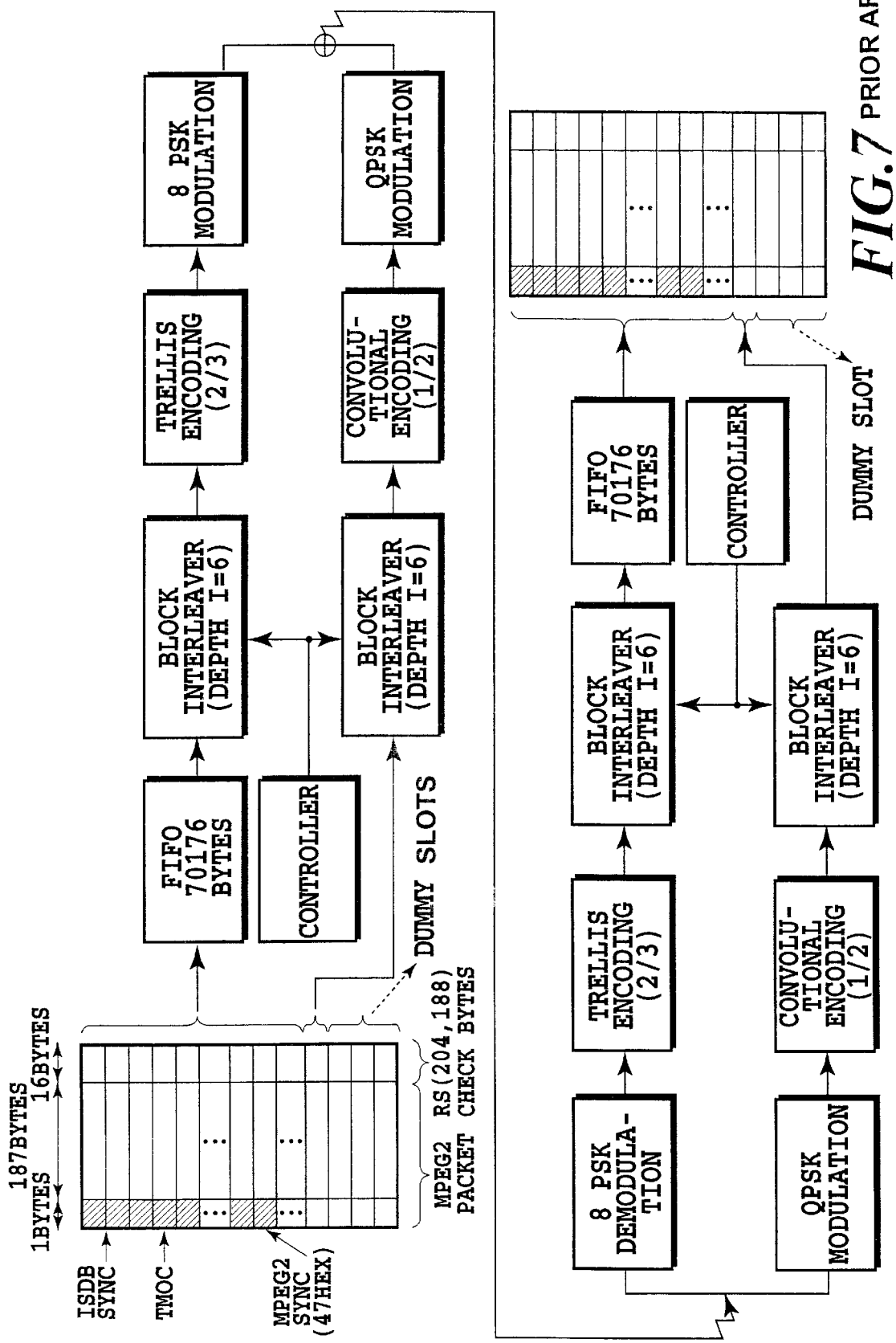
FIG. 7 is a block diagram showing another conventional transmission process.

FIG. 3(b) shows a memory 40 capable of being arrayed in two dimensions. First, when FIG. 3 is assumed to be a process of the transmitter, FIG. 3(a) shows the data arrangement in the super frame 10 before interleave. In contrast, FIG. 3(c) shows the data arrangement after interleave. FIGS. 3(d) to 3(e) schematically shows the data read process from the memory 40.

In the present example, using the memory 40, the interleave process as to the data in the super frame 10 of FIG. 1 is performed. This is to say, the data is written into the memory 40 in the horizontal direction (along the row direction), and the data is read out from the memory 40 in the vertical direction (along the column direction). A more detailed example follows.

As an example, when slot number is 1, the interleave is performed as to the slots #1 of the first to eighth frames 20, and the data is written into the two-dimensional memory 40 along the row direction sequentially from the first slot of the first frame 20. In the present example, the ith data of each frame 20 (shaded area) is written every 203-byte data width.

After the data is written, the data is read out from the memory 40 along the column direction perpendicular to the row direction.

Table 1 shows a sequential arrangement of the actual read addresses and the data read addresses of the first slots according to each frame. Here, the numerals indicate frame-bytes.

TABLE 1

| | Read addresses of first slots (frame-byte) | | |
|---|---|---|---|
| | Start (frame-byte) | Second byte (frame-byte) | 203th byte (frame-byte) |
| first frame | 1-1 | 2-1 | 3-26 |
| second frame | 4-26 | 5-26 | 6-51 |
| third frame | 7-51 | 8-51 | 1-77 |
| fourth frame | 2-77 | 3-77 | 4-102 |
| fifth frame | 5-102 | 6-102 | 7-127 |
| sixth frame | 8-127 | 1-128 | 2-153 |
| seventh frame | 3-153 | 4-153 | 5-178 |
| eighth frame | 6-178 | 7-178 | 8-203 |

By doing the readout process, interleave can be performed independently of the assigned slot number every each frame.

Furthermore, by exchanging the readout direction and the write direction, deinterleave can be performed in the receiver (i.e. the deinterleave process can be performed by writing the data according to the readout direction of the interleave and can be performed by reading out the data according to the write direction of the interleave).

On the other hand, when FIG. 3 is assumed to be a process of the receiver, FIG. 3(c) shows the data before the deinterleave process, and FIG. 3(a) shows the data after the deinterleave process.

INDUSTRIAL APPLICABILITY

As described above, according to the present invention, an interleave frame is formed by combining slots corresponding to the same slot number in each frame when the interleave process is performed in a super frame, and the data are read out along the row or column direction (i.e. readout direction) and the data are written along the direction opposite to the readout direction in the same memory. This makes it possible to obviate complicated memory address controllers according to transmission mode structures in the interleave or deinterleave process, thereby enabling a uniform control in any case.

What is claimed is:

1. A transmitter applicable to a transmission system capable of transmitting digital data, said digital data being encoded by using an error correction code and being modulated by a modulation scheme, said digital data being transmitted as packet units in multiplexed data with a frame structure consisting of N packets, said transmitter performing interleaving of a super frame unit, and comprising:

means for forming an interleave frame by combining packets corresponding to the same slot number in each frame;

write means for sequentially writing data according to a frame number of the interleave frame into a two-dimensionally arrangeable memory along a row or column direction; and readout means for sequentially reading out the written data from the two-dimensionally arrangeable memory along a column or row direction different from the row or column direction of said write means.

2. A receiver applicable to a transmission system capable of transmitting digital data, said digital data being encoded by using an error correction code and being modulated by a modulation technique, said digital data being transmitted as packet units in the multiplexed data with a frame structure consisting of N packets, said receiver performing deinterleaving of a super frame unit, and comprising:

means for forming a deinterleave frame by combining packets corresponding to the same slot number in each frame;

write means for sequentially writing data according to a frame number of the deinterleave frame into a two-dimensionally arrangeable memory along a column or row direction corresponding to a readout direction of an interleave process during transmission; and readout means for sequentially reading out the written data from the two-dimensionally arrangeable memory along a row or column direction different from the column or row direction of said write means and corresponding to a writing direction of the interleave process during transmission.

\* \* \* \* \*